United States Patent
Mountain

(10) Patent No.: US 7,297,613 B1
(45) Date of Patent: Nov. 20, 2007

(54) METHOD OF FABRICATING AND INTEGRATING HIGH QUALITY DECOUPLING CAPACITORS

(75) Inventor: David Jerome Mountain, Baltimore, MD (US)

(73) Assignee: The United States of America as represented by the National Security Agency, Washington, DC (US)

( * ) Notice: Subject to any disclaimer, the term of this patent is extended or adjusted under 35 U.S.C. 154(b) by 414 days.

(21) Appl. No.: 11/149,029

(22) Filed: Jun. 9, 2005

(51) Int. Cl.
*H01L 21/45* (2006.01)

(52) U.S. Cl. ............................. 438/458; 257/E21.122; 438/455

(58) Field of Classification Search ................ 438/455, 438/458; 257/E21.122
See application file for complete search history.

(56) References Cited

U.S. PATENT DOCUMENTS

| | | | |
|---|---|---|---|
| 5,168,078 A * | 12/1992 | Reisman et al. | 438/455 |
| 5,691,245 A * | 11/1997 | Bakhit et al. | 216/20 |
| 6,013,534 A | 1/2000 | Mountain | |
| 6,017,822 A | 1/2000 | Mountain | |
| 6,218,729 B1 | 4/2001 | Zavrel, Jr. et al. | |
| 6,546,538 B1 | 4/2003 | Rubdi et al. | |
| 6,548,338 B2 | 4/2003 | Bernstein et al. | |
| 6,558,998 B2 | 5/2003 | Belleville et al. | |
| 6,614,419 B1 | 9/2003 | May | |
| 6,661,077 B2 | 12/2003 | Mashino | |
| 6,710,421 B2 | 3/2004 | Kamiya | |
| 6,746,942 B2 | 6/2004 | Sato et al. | |
| 6,775,150 B1 | 8/2004 | Chakravorty et al. | |
| 7,189,631 B2 * | 3/2007 | Yamazaki et al. | 438/458 |

* cited by examiner

*Primary Examiner*—Asok Kumar Sarkar
(74) *Attorney, Agent, or Firm*—Shlesinger, Arkwright & Garvey, LLP; Terrence L. B. Brown

(57) ABSTRACT

Method of making an integrated passive, such as a high quality decoupling capacitor, includes providing a first temporary support, a silicon capacitor wafer, and providing an oxide layer and a conductive layer on it. Then, a second temporary support, such as a handle wafer, may be attached to the capacitor wafer (i.e., to the oxide layer on it) by an adhesive bond. The capacitor wafer may then be destructively removed. A second conductive layer is then provided on an exposed backside of the oxide layer. The addition of a second electrode on the second conductive layer yields the desired high quality capacitor. Further processing steps, such as solder bumping, may be carried out while the capacitor wafer is still attached to the handle wafer. When the desired processing steps are complete, the handle wafer is removed, and the relatively thin high quality integrated capacitor wafer results.

24 Claims, 2 Drawing Sheets

US 7,297,613 B1

METHOD OF FABRICATING AND INTEGRATING HIGH QUALITY DECOUPLING CAPACITORS

FIELD OF THE INVENTION

The invention relates to a method of making an integrated passive. More particularly, the method relates to fabricating a high quality integrated passive, such as a capacitor, including a high quality thermal oxide. Even more particularly, the method relates to a method of fabricating and integrating a high quality decoupling capacitor.

BACKGROUND OF THE INVENTION

Passives, such as resistors, inductors, and capacitors are known.

Research has been directed to the development of integrated passives, such as capacitors, and providing, e.g., decoupling capacitance, physically close to the integrated circuit (IC).

Applicant's earlier patents directed to semiconductor device manufacturing processes include:

U.S. Pat. No. 6,013,534 to Mountain, entitled "Method of Thinning Integrated Circuits Received in Die Form", issued Jan. 11, 2000, which is incorporated herein by reference; and U.S. Pat. No. 6,017,822 to Mountain, entitled "Method of Thinning Semiconducted Wafer of Smaller Diameter than Thinning Equipment Was Designed For", issued Jan. 25, 2000, and which is incorporated herein by reference.

Additional known United States patent documents include:

U.S. Pat. No. 6,218,729 B1 to Zavrel, Jr. et al.;
U.S. Pat. No. 6,558,998 B2 to Belleville et al.; and
U.S. Pat. No. 6,548,338 B2 to Bernstein et al. Other known U.S. patents include:
U.S. Pat. No. 6,746,942 B2 to Sato et al.;
U.S. Pat. No. 6,710,421 B2 to Kamiya;
U.S. Pat. No. 6,661,077 B2 to Mashino;
U.S. Pat. No. 6,775,150 B1 to Chakravorty et al.;
U.S. Pat. No. 6,614,419 B1 to May; and
U.S. Pat. No. 6,546,538 B1 to Rubdi et al.

There are known methods of integrating chips and capacitors to achieve denser assemblies and with the capacitance capability required of the ICs.

U.S. Pat. No. 6,218,729 to Zarrel, Jr. et al. discloses a method for densifying assemblies by integrating capacitors into the substrates on which ICs are attached.

U.S. Pat. No. 6,558,998 B2 to Belleville et al. and U.S. Pat. No. 6,548,338 B2 to Bernstein set forth above describe methods of building capacitors as part of the IC fabrication process.

Known techniques have often been complicated, required unusual processing sequences, and have failed to keep up with the demand for compact, low profile applications.

Further, cell phones and the like may require even more passives, such as capacitors, than integrated circuits.

Similarly, high-speed processors require large amounts of decoupling capacitance as physically close as possible to the IC(s).

There is thus a need for a method of fabricating integrated passives, such as capacitors, that overcomes the drawbacks of the prior art.

It can be seen that there likewise is a need for a method of providing integrated passives, such as capacitors, as close as possible to the associated IC(s).

OBJECTS AND SUMMARY OF THE INVENTION

It is an object of the invention to overcome the drawbacks of the prior art.

It is a further object of the invention to provide components thinner than prior art components, and with the possibility of reducing the space required when mounting on an IC surface.

It is a further object of the invention to provide a silicon wafer as a substrate which is compatible with high quality thermal oxides, and then, for example, removing the substrate completely as part of the fabrication process.

Another object of the invention is to provide a method of providing a high quality thermal oxide layer on a silicon wafer, which will serve as a temporary substrate on which to fabricate at least a part of a passive, and then provide, such as by deposition or sputtering, a high quality metal layer, such as an aluminum layer, on the thermal oxide layer.

A further object of the invention is to provide a method of producing a passive, such as a capacitor, by which one yields a desired capacitance wherever one wants such capacitance, in an integrated passive.

Yet another object of the invention is to substantially eliminate solder balls with optional 3-dimensional integration of an integrated passive, such as a capacitor.

A further object of the invention is to avoid the prior art drawback of building a capacitor on the chip; rather, a further object is to provide a capacitor sized and configured so that the chip may be provided on the capacitor.

A further object of the invention is to provide a passive, such as a capacitor, which yields an integrated passive that minimizes production costs while maximizing quality; namely, there are no quality versus cost trade-offs.

Yet another object of the invention is to provide a passive, such as a capacitor, sized and configured so that a chip may be provided within a perimeter of solder connections or solder bumps on the capacitor, and at a desired distance from an electrode of the capacitor, for example.

Another object of the invention is to provide for the manufacturing of integrated passives, such as capacitors, having superior electrical and physical characteristics as compared to known devices.

A further object of the invention is to provide for the use of a releasable adhesive or bonding material for enhancing and simplifying the process of producing such passives, such as when using capacitance wafers.

Another object of the invention is to provide a method of fabricating decoupling capacitors with high capacitance values, low parasitic losses, good yield, and long-term reliability.

Another still further object of the invention is to provide a method of fabricating passives, such as inductors and resistors, as well as interconnect lines.

Yet another object of the invention is to provide for the use of thinned acrylic bonding material during one or more of the fabrication steps.

Yet another object of the invention is to use a fabrication process which minimizes package thicknesses as compared with known technologies, while providing the desired quality and reliability.

Another object of the invention is to provide a method of fabricating integrated passives, such as capacitors, which are readily manufactured, even in conventional production lines.

In summary, the invention is directed to a method of fabricating a high quality capacitor that includes providing a substrate, such as a capacitor wafer, having a topside, a thickness, and a diameter, and providing an oxide layer on the topside of the capacitor wafer to yield an oxide layer having a topside. One may then provide a conductive layer on the topside of the oxide layer, and a handle wafer on the topside of the oxide layer. The handle wafer may have a thickness, and a diameter, the thickness being substantially constant, and the diameter being substantially the same as the diameter of the capacitor wafer. Further, the method may include providing an adhesive on the topside of the handle wafer for adhering the topside of the handle wafer to the topside of the oxide layer. The adhered handle wafer and the capacitor wafer may be treated in a wafer bonder to yield a wafer stack including a bond. The capacitor wafer may then be removed by thinning a backside of the capacitor wafer to yield an exposed backside of the oxide layer. A second conductive layer, as well as an electrode, may then be provided on the backside of the oxide layer to yield a high quality capacitor. After additional processing steps, such as bumping and adding an IC, the handle wafer may be removed from the wafer stack.

The invention may include the attaching of a capacitor wafer and a handle wafer to each other by an adhesive layer, such as BCB (e.g., bisbenzocyclobutene or benzocyclobutane).

The fabrication of the inventive passive likewise may include use of a thinned adhesive, an acrylic, which is readily removable with a solvent, such as acetone, when attaching substrates, such as wafers, in the production process.

The inventive method overcomes the prior art drawback of providing relatively large solder bumps on relatively thin passives, such as capacitors.

The inventive method likewise includes the fabrication of thinner passives, such as capacitors, which are as thin as possible to the point at which the minimum amount of material necessary for functionality remains.

After completion of the initial process, the capacitor wafer may be tested, diced, and flip-chip assembled. A bonded supporting substrate, such as a handle wafer, may then be released, yielding the desired extremely dense assembly.

Relative terms such as left, right, topside, backside, height, width, up, and down are for convenience only and are not intended to be limiting.

DETAILED DESCRIPTION OF THE INVENTION

FIGS. 1-7 schematically show, in the form of a series of Figures, an embodiment according to the invention of a fabrication method or process for producing a passive, such as a capacitor, and which capacitor is assembled with a chip.

FIGS. 1-7 may be considered successive individual process steps, for ease of discussion; and, depending on the requirements of the end user, on the materials and processes used, and on the processing facilities available, each of FIGS. 1-7 may or may not be successive fabrication steps.

Figure 1:
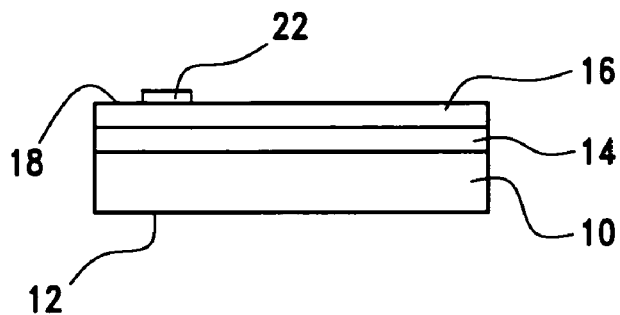
FIG. 1 schematically illustrates a step of a process according to an embodiment of the invention for fabricating an integrated passive, such as a capacitor, in which a support, such as a capacitor wafer, has been provided with a conductive layer, an oxide layer, and a first electrode.

An initial step shown in FIG. 1 may include providing a first temporary support or substrate 10 for fabricating the passive, and which support may be a silicon wafer.

First temporary substrate 10 may be provided with one or more of dielectrics, such as oxide layer 14. Layer 14 may include a high quality oxide, such as a thermal oxide.

First support 10 may be a six inch (e.g., a 150 mm) silicon wafer, for example, and a conductive layer 16 may be likewise provided by a known process involving the deposition and, typically, patterning of a metal layer, such as an aluminum (Al) layer on oxide layer 14.

Thanks to the use of a silicon substrate for support 10, oxide layer 14 may be a high quality thermal oxide layer. For sake of discussion, the passive fabricated in the steps of FIGS. 1-7 will be described as the production of a high quality capacitor.

A first electrode 22 may then be fabricated on a topside 18 of metallization layer 16.

If desired, vias through the oxide layer may be patterned.

Figure 2:
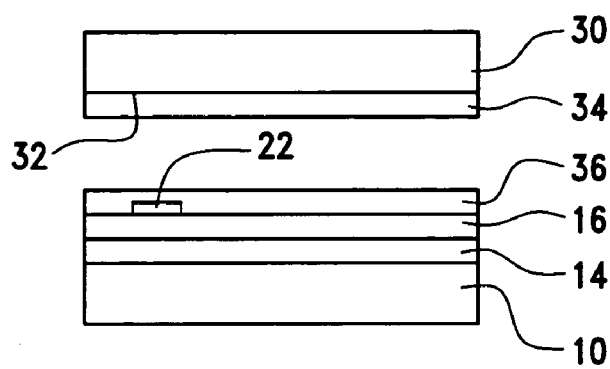
FIG. 2 schematically illustrates a step of a process according to the invention for fabricating an integrated passive, such as a capacitor, in which a second temporary support, such as a handle wafer, has been provided with an adhesive layer, and the capacitor wafer of FIG. 1 has been provided with an adhesive layer.

FIG. 2 schematically illustrates a further step of providing a second temporary support 30, such as a handle wafer, to which first temporary support 10 may be attached.

Good results have been achieved when the second temporary support 30 has a uniform thickness. Such uniform thickness has ensured that in a later wafer thinning or destructive removal steps the processing is more uniform.

An adhesive or bonding layer 34 may be provided on topside 32 of second support 30.

The fabricator may now perform a step of providing an adhesive 36 on a topside of the conductive layer 16 of FIG. 2.

Second temporary support 30 may be in the form of a known handle wafer or other support or substrate configured for mating well with the wafer 10 of FIG. 2. Such mating has been achieved with good results by providing second temporary support 30 in the form of a substrate, such as a silicon wafer, which has the same width, extent, and outer perimeter as wafer 10; i.e., is substantially the same size and covers substantially the same footprint as viewed in plan. In this manner, wafer 10 is evenly supported over its entire extent during processing steps in which forces are exerted on wafer 10, for example. Such even support over its entire footprint has provided for the desired high quality fabrication in practice.

The handle wafer 30 may be made of a conventional material such as glass.

The handle wafer 30 material may also include a stainless steel, or any material compatible with the adhesive (e.g. acrylic) and the bonding process described immediately below.

Attaching of the handle wafer 30 to wafer 10 may be carried out by bonding a topside 18 of metallization layer 16 to the topside of handle wafer or second temporary support 30 with an adhesive material, such as BCB or acrylic, and the BCB or acrylic may be spun onto one or both of handle wafer 30 and the capacitor wafer 10. For example, the BCB or acrylic may be spun onto a surface of the conductive layer 16 (onto the topside as shown) of wafer 10 that will face the second support 30, and the BCB or acrylic may likewise be spun on a counterpart surface of the second temporary support 30 which will face the conductive layer 16. A resultant wafer stack 40; i.e. adhered support 30 and capacitor wafer 10 may then be bonded, e.g., soft baked, in accordance with a known process, for example.

The adhesive of bonding layers 34 and 36 may include an acrylic, which has been spun onto both respective opposed wafer surfaces.

An acrylic used as the bonding material of layers 34 and 36 may include a commercially available acrylic material such as HumiSeal® 1B31 (HumiSeal® is a registered trademark of Chase Corporation, Braintree, Mass.), www.humiseal.com. Such commercially available HumiSeal® may be first diluted by 50% volume with acetone. Such dilution allows for deposition of a relatively thin, uniform layer of acrylic to be deposited on the wafer surfaces by spin coating.

Details of the use of a diluted acrylic, described above, and of the bonding with a conventional wafer bonder, described immediately below, are set forth in Applicant's co-pending application Ser. No. 11/134,600, entitled "Method for Thinning a Bumped Wafer", filed May 16, 2005, and which is incorporated herein by reference.

Good results have been achieved when using an Electronic Visions wafer bonder available from EVGroup, Schärding, Austria (Electronic Visions Group, www.evgroup.com).

Figure 3:
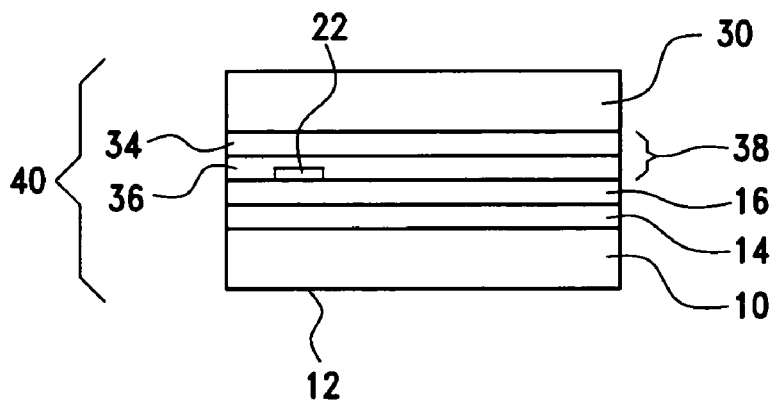
FIG. 3 schematically illustrates a step of a process according to the invention for fabricating an integrated passive, such as a capacitor, in which the second temporary support and the capacitor wafer have been bonded together to form a wafer stack.

This bonded stack including handle wafer 30 and capacitor wafer 10 is shown in FIG. 3.

Wafers 10 and 30 may be oriented, pressed, and bonded together in a wafer bonder under a force of about 2 times atmospheric pressure.

A resultant bonded adhesive layer 38 made of layers 34 and 36 is shown to simply point out the layers which were used to produce layer 38.

Owing to use of the wafer bonder according to the vendor specifications, as described in the above-incorporated co-pending application, and in the inventive manner, little or no air can be trapped when the respective adhesive layers 34 and 36 are contacted to form bonding layer 38. For example, in the case of acrylic, elevated temperature and high pressure allow for the acrylic films to flow over any topography on the opposed surfaces of wafers 10 and 30 that is common for finished semiconductor device wafer. Therefore, no or substantially no voids are present in the resultant acrylic bond layer 38, and it is relatively strong, even though layer 38 is relatively thin. Good results have been achieved when layer 38 has been formed with BCB as the adhesive of layers 34 and 36, and with a resultant cured bond thickness of about 8 microns.

Figure 4:
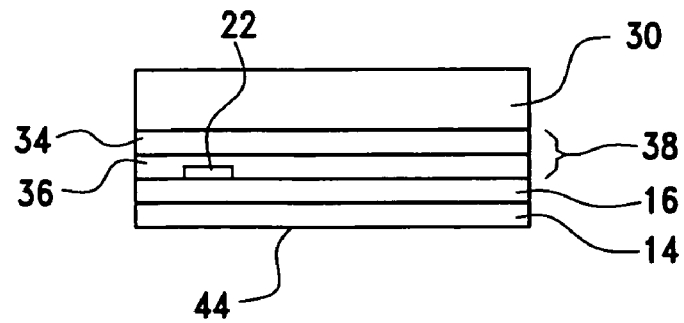
FIG. 4 schematically illustrates a step of a-process according to the invention for fabricating an integrated passive, such as a capacitor, in which the capacitor wafer has been removed.

FIG. 4 shows that after the stack wafer bonding process of FIGS. 2 and 3, the silicon substrate wafer 10 may be thinned by using a known, readily available process including one or more of etching, grinding, and polishing, for example. That thinning/removal will typically be a destructive removal process which completely or substantially completely removes the silicon wafer 10. Appropriate equipment is readily available for carrying out such processes of thinning the silicon wafer.

The thermal oxide layer 14 may serve as an excellent etch stop during the destructive removal process.

After the silicon capacitor wafer 10 has been destructively removed in the step of FIG. 4, oxide 14 of the desired thickness and quality remains, and has an exposed backside 44.

The bonding and thinning processes described above are applicable to any type of passive device fabrication.

Figure 5:
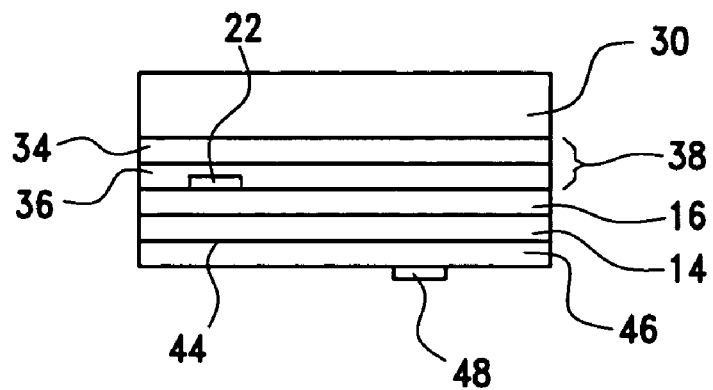
FIG. 5 schematically illustrates a step of a process according to the invention for fabricating an integrated passive, such as a capacitor, in which a second conductive layer and a second electrode have been deposited on a backside of the oxide layer of FIG. 4.

FIG. 5 illustrates a step of adding an additional or second metallization layer 46, such as a high quality aluminum layer, to backside 44 of oxide layer 14.

Vias through oxide layer 14 to first electrode 22 may be formed, if required, prior to the addition of metallization layer 46.

Second Metallization layer 46, may be formed by depositing and patterning, and may be an aluminum layer.

Second metallization layer 46 may be formed to include a second electrode 48.

As shown, a capacitor including oxide layer 14, aluminum layers 16 and 46, and electrodes 22 and 48, has thus been formed.

Good results have been achieved, in the case where acrylic was used as the adhesive, when a relatively short wet strip at ambient temperature in acetone was used to readily remove the above-described original bond layer. This wet strip solvent has been successfully used without it attacking the device wafer.

Figure 6:
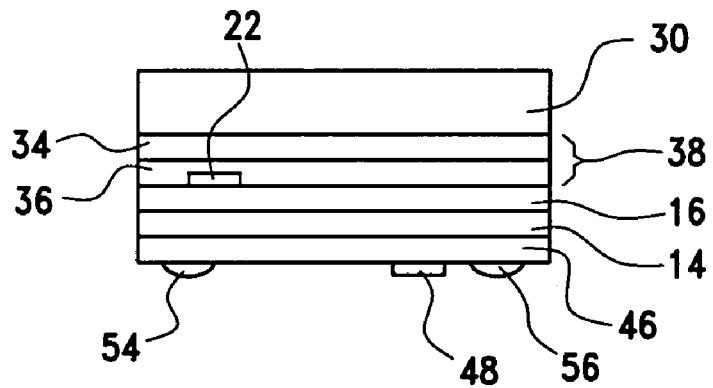
FIG. 6 schematically illustrates a step of a process according to the invention for fabricating an integrated passive, such as a capacitor, in which one or more (as shown) solder bumps have been added to the backside conductive or metallization layer.
Figure 7:
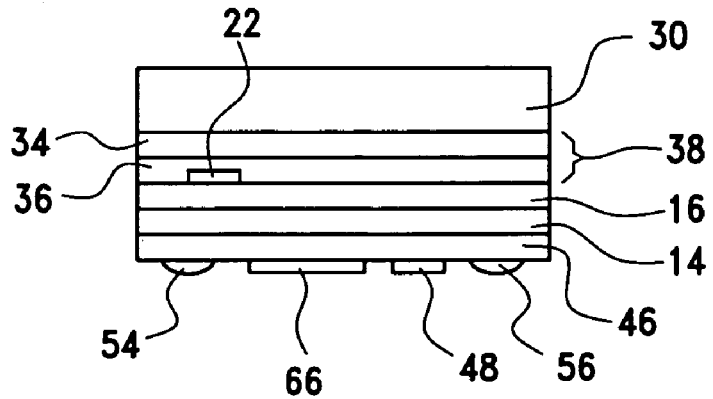
FIG. 7 schematically illustrates a step of a process according to the invention for fabricating an integrated passive, such as a capacitor, and in which the integrated passive is assembled onto an integrated circuit using the solder bumps of FIG. 6.

FIG. 6 shows a bumping process which may then be completed, such as by electroplating, printing, or solder dispense. Depending on the end use, relatively few process steps remain. Second metal layer 46, as shown in FIG. 6, may be provided with one or more solder bumps 54 and 56, as shown. Solder bumps 54 and 56 may be micro-bumps.

Wafer bumps 54 and 56 may be relatively large solder bumps, depending on the intended use, such as for assembly to a processor chip, and in accordance with the invention.

This method is believed to be compatible with most conventional solders in the industry, and bumps other than the usual solder, such as gold (Au) bumps may be provided, although such may be more time-consuming to fabricate.

It will be seen that the goal of providing a capacitor as thin as possible to minimize its height and meet the requirements of thinner devices, such as integrated passives, has been achieved.

After the electrode fabrication and solder bumping of FIG. 6, any additional capacitor or other integrated passive processing steps may be completed while handle wafer 30 is still attached. For example, the capacitor may be tested, diced, and the like prior to its use.

The tested and diced integrated passive may then be assembled to an integrated circuit 66, using solder bumps 54 and 56.

At an appropriate time, the finished capacitor may be released, such as after it has been attached to its final substrate, in use. The remaining bond 38 between handle wafer 30 and the first metal layer 16 may be removed, such as by being dissolved in acetone in the case of acrylic bonds.

Prior to being released, chip 66 and its associated capacitor may be flip-chip assembled. Thanks to the micro-bump joining and close proximity, the capacitor maximizes electrical decoupling while minimizing parasitic losses.

Good results have been achieved when capacitors wafers have been produced in accordance with the fabrication steps of the embodiment of FIGS. 1-7.

As regards the use of alternate dielectric and electrode materials, alternate dielectric materials such as PZT or Barium Titanate can be used because the silicon substrate is compatible with multiple methods of deposition and can withstand very high processing temperatures. Other electrodes besides aluminum (such as copper) can also be used. Other passive components can also be partially or fully fabricated at this point.

As to using different bonding materials, easily releasable bonding materials such as acrylic or PVA can be used. This may be most useful when the capacitor chip needs to be extremely thin when assembled onto the processor.

It is further contemplated that as regards capacitor wafer thinning other possible final steps may be included to maximize the uniformity of the thinning process and/or the quality of the capacitor dielectric:
1. if the capacitor is fabricated on an SOI (silicon on insulator) wafer the buried oxide layer serves as a natural etch stop for chemical solutions such as ethylene-diamine pyrocatechol (EPD) or tetramethyl ammonium hydroxide (TMAH); in this case a layer of oxide or nitride may protect the back of the handle wafer; the extremely thin (<1 micron) silicon remaining can be quickly removed by various processes that do not damage the thermal oxide or alternate dielectric materials.
2. if the capacitor is fabricated on a wafer with a lightly doped epitaxial layer on top of a heavily doped substrate, as is common in many silicon processes, solutions of Nitric:HF:Acetic acid will preferentially etch the silicon with high doping levels; the interface between the two layers thus may serve as an etch stop; this also preserves the electrical quality of the dielectric.

It is also contemplated that as regards backside processing:
1. after thinning is complete, other passive components can also be fully fabricated or complete their fabrication at this point.

It is likewise contemplated that as regards assembly/transfer/release process steps:
1. as regards assembly and release of the substrate, depending on the thickness required for the capacitor chip, it can be thinned or destructively removed by conventional means (backgrind, etc.); if space above the processor chip is at a premium, the handle piece can be released to make the capacitor chip very thin (a few microns at most); solvent or water soaks, as needed can be used to release the bond; use of porous supports and ultrasonic agitation will also greatly accelerate the release time, reducing it to a few minutes in some cases.
2. materials other than BCB, and acrylic, can be used for the transfer bond; an example is polyvinyl alcohol (PVA), which is water-soluble; if PVA is used, the bonded material can be released using a water soak, which will be very benign to other components in the environment, including the materials used for attaching the device to its final substrate; polymethyl Methacrylate (PMMA), wax, or other materials may also be used as the adhesive; and
3. specialized handle wafers can be used; for example, a substrate with a porous silicon layer on top, or a glass substrate, can be used for the handle; these are especially useful if the capacitor chip needs to be extremely thin when assembled onto the processor; after bonding, a high-speed jet stream can split open the porous silicon layer, leaving only a thin silicon layer to be removed.

It is contemplated that as regards handle wafer removal:
1. if special release layers have been incorporated into the handle wafer, appropriate release mechanisms for them such as temperature, UV (ultraviolet) irradiation, etc. may be used.

It is also contemplated that as regards assembly release:
1. removal of vacuum, UV irradiation, water soaks, and the like, as needed, can be used; use of porous supports and ultrasonic agitation will also greatly accelerate the release time, reducing it to a few minutes in some cases.

While this invention has been described as having a preferred design, it is understood that it is capable of further modifications, and uses and/or adaptations of the invention and following in general the principle of the invention and including such departures from the present disclosure as come within the known or customary practice in the art to which the invention pertains, and as may be applied to the central features hereinbefore set forth, and fall within the scope of the invention or limits of the claims appended hereto.

What is claimed is:

1. Method of making an integrated capacitor, comprising:
a) providing a first temporary support having a topside;
b) providing an oxide layer on the topside of the first temporary support to yield an oxide layer having a topside;
c) providing a first conductive layer on the topside of the oxide layer to yield a first conductive layer having a topside;
d) providing a first electrode on the first conductive layer;
e) providing a second temporary support having a topside;
f) attaching the second temporary support to the topside of the first conductive layer;
g) removing the first temporary support from the oxide layer to expose a backside of the oxide layer;
h) providing a second conductive layer on the exposed backside of the oxide layer to yield a second conductive layer having a backside;
i) providing a second electrode on the backside of the second conductive layer; and
j) the oxide layer, the first and second conductive layers, and the first and second electrodes defining a capacitor.

2. Method as in claim 1, further comprising:
a) adding a solder bump to the backside of the second conductive layer.

3. Method as in claim 1, wherein:
a) the topside of the first conductive layer is attached to the second temporary support with an adhesive.

4. Method as in claim 3, wherein:
a) the adhesive includes an acrylic thinned with acetone to yield a thinned acrylic prior to applying the thinned acrylic to the second temporary support.

5. Method as in claim 3, wherein:
a) the adhesive includes an acrylic thinned with acetone prior to applying the thinned acrylic to the second temporary support and prior to applying the thinned acrylic to the topside of the first conductive layer.

6. Method as in claim 3, wherein:
a) the adhesive includes bisbenzocyclobutene.

7. Method as in claim 1, wherein:
a) the first conductive layer includes an aluminum layer.

8. Method as in claim 1, further comprising:
a) adding a perimeter of solder bumps on the backside of the second conductive layer.

9. Method as in claim 8, further comprising:
a) flip-chip assembling the integrated capacitor to an integrated circuit.

10. Method as in claim 1, wherein:
a) the first temporary support is removed by etching; and
b) the oxide layer is sized and configured to function as an etch stop layer.

11. Method as in claim 1, wherein:
a) the first temporary support includes a silicon wafer;
b) the first conductive layer includes an aluminum layer;
c) the second conductive layer includes an aluminum layer; and
d) the second temporary support includes a handle wafer.

12. Method as in claim 1, wherein:
a) the first temporary support includes a silicon wafer; and
b) the oxide layer includes a thermal oxide grown on the silicon wafer.

13. Method as in claim 12, wherein:
a) the providing of the first conductive layer includes depositing and patterning an aluminum layer on the topside of the thermal oxide layer.

14. Method as in claim 1, wherein:
a) the providing of the first conductive layer includes depositing and patterning an aluminum layer on the topside of the oxide layer.

15. Method as in claim 1, wherein:
a) the first temporary support includes a silicon wafer; and
b) the providing of an oxide layer includes growing a thermal oxide on the silicon wafer.

16. Method as in claim 1, wherein:
a) the second temporary support includes a handle wafer.

17. Method as in claim 16, wherein:
a) the handle wafer includes one of a glass and a stainless handle wafer.

18. Method as in claim 1, wherein:
a) the attaching of the second temporary support to the topside of the first conductive layer includes adhering the topside of the second temporary support to the topside of the first conductive layer with BCB to yield a wafer stack;
b) the first conductive layer includes an aluminum layer; and
c) the wafer stack is treated in a wafer bonder.

19. Method as in claim 1, wherein:
a) the first temporary support includes a capacitor wafer;
b) the oxide layer includes a thermal oxide grown on the capacitor wafer;
c) the first conductive layer includes an aluminum layer;
d) the second conductive layer includes an aluminum layer; and
e) the second temporary support includes a handle wafer having a thickness, and a diameter, the thickness being substantially constant, and the diameter of the handle wafer being substantially the same as a diameter of the capacitor wafer.

20. Method as in claim 19, wherein:
a) the attaching of the handle wafer to the topside of the first aluminum layer includes adhering the topside of the handle wafer to the topside of the first aluminum layer with BCB to yield a wafer stack; and
b) the wafer stack is treated in a wafer bonder.

21. Method as in claim 20, wherein:
a) the treating of the adhered handle wafer and capacitor wafer includes soft baking of the wafer stack in a wafer bonder to preclude the trapping of air in the bond.

22. Method as in claim 1, wherein:
a) the second temporary support is released from the topside of the first conductive layer.

23. Method as in claim 1, further comprising:
a) fabricating additional high quality passive devices, including resistors and inductors.

24. Method as in claim 1, further comprising:
a) directly bonding the integrated capacitor to an integrated circuit.

* * * * *